United States Patent [19]

Yamada et al.

[11] Patent Number: 4,984,054

[45] Date of Patent: Jan. 8, 1991

[54] ELECTRIC FUSE FOR A REDUNDANCY CIRCUIT

[75] Inventors: Michihiro Yamada; Hiroshi Miyamoto; Tadato Yamagata; Shigeru Mori, all of Hyogo, Japan

[73] Assignee: Mitsubishi Denki Kabushiki Kaisha, Tokyo, Japan

[21] Appl. No.: 481,683

[22] Filed: Feb. 20, 1990

Related U.S. Application Data

[63] Continuation of Ser. No. 132,619, Nov. 23, 1987, abandoned.

[30] Foreign Application Priority Data

Dec. 1, 1986 [JP] Japan ................................ 61-287331

[51] Int. Cl.$^5$ ..................... H01L 27/12; H01L 27/02; H01L 29/34; H01L 29/06
[52] U.S. Cl. ........................................... 357/51; 357/4; 357/54; 357/56; 357/59
[58] Field of Search ................... 357/51, 54, 55, 56, 357/59, 4

[56] References Cited

U.S. PATENT DOCUMENTS

| | | |
|---|---|---|
| 4,389,715 | 6/1983 | Eaton, Jr. et al. |
| 4,503,315 | 3/1985 | Kamioka et al. ........................ 357/51 |
| 4,723,155 | 4/1988 | Uchida ................................... 357/51 |
| 4,748,491 | 5/1988 | Takagi .................................... 357/51 |
| 4,774,561 | 9/1988 | Takagi .................................... 357/51 |

FOREIGN PATENT DOCUMENTS

| | | | |
|---|---|---|---|
| 0241046 | 10/1987 | European Pat. Off. ............... | 357/51 |
| 52-28280 | 3/1977 | Japan ..................................... | 357/51 |
| 59-148198 | 8/1984 | Japan ..................................... | 357/51 |

OTHER PUBLICATIONS

"A 256K RAM Fabricated with Molybdenum-Polysilicon Technology", *IEEE International Solid-State Circuits Conference* held 2/15/80 by Tsuneo Mano et al.

"Designing Static RAMS For Yield as Well as Speed", by Rahul Sud et al., *Electronics*, pp. 121–123 and 127–130, issued by McGra-Hill Book Company, Jul. 1981.

*Primary Examiner*—J. Carroll
*Attorney, Agent, or Firm*—Lowe, Price, LeBlanc, Becker & Shur

[57] ABSTRACT

The present invention comprises a field oxide film formed on a silicon substrate, an underlying film of polycrystal silicon formed on a portion thereof and an insulating film formed so as to cover the field oxide film comprising the underlying film. A surface stepped portion of the insulating film is formed by a portion with an underlying film and a portion without an underlying film under the insulating film, and a blowout portion of a fuse is formed along the surface stepped portion. There are terminal portions at both ends of the blowout portion of the fuse and an aluminum line is connected thereto. In addition, the whole portions comprising the fuse portion are covered with another insulating film and the whole is protected. The fuse is employed as one example in a redundancy circuit of a MOS dynamic RAM having redundancy memory cells.

32 Claims, 5 Drawing Sheets

ELECTRIC FUSE FOR A REDUNDANCY CIRCUIT

This application is a continuation of application Ser. No. 07/132,619, filed on Nov. 23, 1987, now abandoned.

BACKGROUND OF THE INVENTION

1. Field of the Invention

The present invention relates to an electric fuse for a redundancy circuit used as a redundancy circuit in a semiconductor memory and, more particularly, to a structure of an electric fuse for a redundancy circuit capable of being blown out easily and reliably at a low voltage.

2. Description of the Prior Art

As the capacity of a MOS dynamic RAM becomes larger, it is inevitable that the size of a chip increases and a manufacturing process becomes fine. Because of this increase of the size of a chip and a fine process, the rate of existence of crystal defects in one chip increases, and a larger influence comes to be exerted on an occurrence of defective memory cells by pattern defects and dust produced during a manufacturing process. Thus, recently measures have been taken to provide spare redundancy memory cells in a memory chip of a MOS dynamic RAM for replacing defective memory cells produced by a crystal defect, a pattern defect and dust with redundancy memory cells to remedy a memory chip, that is, to use a so-called redundancy circuit.

In a redundancy circuit, fuses for a redundancy circuit are necessary to replace defective memory cells with redundancy memory cells and there are two kinds of fuses, that is, (1) the one which is blown out by a laser light beam, and (2) the one which is blown out by electricity (electric fuse for a redundancy circuit).

FIG. 1 is a block diagram showing a conventional MOS dynamic RAM, comprising a circuit portion for replacing defective memory cells with redundancy memory cells by using a redundancy circuit. Referring to FIG. 1, reference characters Ext. $A_O$–$A_N$ denote external address signals, a reference numeral 101 denotes an address buffer, reference characters $A_O$–$A_N$ and $\overline{A_O}$–$\overline{A_N}$ denote output signals and its inverted signals of an address buffer, reference numeral 102 denotes a row decoder, reference numeral 103 denotes a column decoder, reference numeral 104 denotes a sense amplifier, reference numeral 105 denotes a m × n memory cell array, reference numeral 106 denotes a fuse control circuit serving as a redundancy circuit using fuses, and reference numeral 107 denotes an address coincidence circuit. In FIG. 1, the column decoder 103 comprises one spare 103S, the sense amplifier 104 comprises one spare 104S and the memory cell array comprises a plurality (m) of spares 105S in the direction of a column. Prior to a description of the drawing, an example and an operation of the fused control circuit 106 are now described.

FIG. 2 is an example of a circuit diagram showing in detail the fuse control circuit 106 serving as a redundancy circuit shown in a block diagram in FIG. 1, in which only a circuit related to the external address signal Ext. $A_O$ is shown for simplification. Referring to FIG. 2, reference characters Q1, Q2, Q3, Q4 and Q6 denote N-channel MOS transistors, reference characters Q5 and Q7 denote P-channel MOS transistors, reference character INV denotes an inverter, reference character R denotes a resistor, reference characters $V_{PP}$ and $V_{P2}$ denote applied voltages, references character $T_i$ denotes an input inputting the external address signal Ext. $A_O$, reference character $T_o$ denotes an output, reference characters N1, N2 and N3 denote nodes, reference characters $A_O$ and $\overline{A_O}$ denote output signals from an address buffer, reference numeral 30 denotes a fuse portion and reference characters 4a and 4b denote aluminum lines connected to a fuse portion.

Next, an operation is described. To blow out the fuse portion 30, a voltage of 10–15 V is applied to the input $T_i$, a voltage of 10–15 V is applied to the $V_{pp}$ and a voltage higher than 10 V is applied to the $V_{p2}$. As a result, the node N1 is rendered to be a value exceeding 10 V and the fuse portion 30 is blown out.

An operation of that circuit when the fuse portion 30 is blown out is described in the following. That is, since the node N2 becomes low level and the node N3 becomes high level, the N-channel MOS transistor Q4 and the P-channel MOS transistor Q5 turn on, while the N-channel MOS transistor Q6 and P-channel MOS transistor Q7 turn off. Therefore, the output $\overline{A_O}$ of the address buffer is outputted to the output $T_o$.

Meanwhile, an operation of the circuit when the fuse portion 30 is not blown out is described in the following. Since the node N2 becomes high level and the node N3 becomes low level, the N-channel MOS transistor Q4 and the P-channel MOS transistor Q5 turn off, while the N-channel MOS transistor Q6 and P-channel MOS transistor Q7 become on. Therefore, the output $A_O$ of the address buffer is outputted to the output $T_o$.

Therefore, the fuse control circuit shown in FIG. 1 has the role of programming the external address signal Ext. $A_O$ depending on whether the fuse portion 30 is blown out or not.

The fuse control circuit 106 shown in FIG. 1 has the above-mentioned function and is connected to the address coincidence circuit 107. If defective cells exist in the memory cell array 105, and a column address in which the defective cells exist and a column address programmed by the fuse control circuit 106 coincide, a portion of an applicable column address of the column decoder 103 is made ineffective and at the same time the spare column decoder 103S is made effective. In that operation, defective cells in the memory cell array 105 can be replaced with the spare memory cell 105S.

FIG. 3A is a plan view showing a structure of an electric fuse for a redundancy circuit used for a redundancy circuit in a conventional MOS dynamic RAM, and FIG. 3B is a sectional view taken along the line 3B—3B in FIG. 3A.

Referring to FIGS. 3A and 3B, a field oxide film 2 is formed on a silicon substrate 1, and is usually of 0.5–1.0 μm in thickness. A fuse portion 30 made of a polycrystal silicon film is formed on the field oxide film 2, and comprises a blowout portion 30c of the width W and terminal portions 30a and 30b connected to the opposite ends of the portion 30c. An insulating film 52 also covers the fuse portion 30, the aluminum line 4 and the field oxide film 2 for insulating protection. The blowout portion 30c is blown out electrically by conducting a current larger than a predetermined current. The terminal portion 30a is connected electrically to an aluminum line 4a by contacts 5a and the terminal portion 30b is connected electrically to an aluminum line 4b by contacts 5b.

FIG. 4 is a view showing only a circuit portion for blowing out an electric fuse for a redundancy circuit out of the fuse control circuit shown in FIG. 2.

Referring to FIG. 4, one end of the fuse portion 30 is connected to a power supply $V_{pp}$ for current supply via the aluminum line and the other end is connected to the drain of a MOS transistor Q2. The MOS transistor Q2 having its source connected to ground level (OV) and its gate electrode receiving a control clock signal $\phi$. In order to blow out the blowout portion of the fuse portion 30, the level of the power supply $V_{pp}$ is raised up to approximately 10–15 V and also the level of the control clock signal $\phi$ is raised up to approximately 10–15 V to turn on the MOS transistor. As a result, a current flows from the power supply $V_{pp}$ through the fuse portion 30 to blow out the blowout portion electrically. At that time, it is important to increase a current density which flows through the blowout portion 30c and it is necessary to make the width W of the blowout portion 30c as small as possible.

Meanwhile, in a conventional electric fuse for a redundancy circuit, the width W of the blowout portion 30c is defined by photolithographic technique, that is, the width W is usually approximately 1 μm. Thus, in order to increase a current density flowing through the blowout portion 30c, it is necessary to increase the level of the power supply $V_{pp}$ applied and the level of the control clock signal $\phi$, which become above 10 V in most cases. However, problems were caused that an unfavorable influence could be exerted upon the reliability of a memory chip by application of an overvoltage as high as over 10 V, and in addition, an overvoltage more than 10 V cannot be applied in effect because of a decreased withstand voltage of the pn junction and a decreased withstand voltage between the source and drain of a MOS transistor due to the fact that the manufacturing process becomes fine.

As another prior art, an architecture of a dynamic RAM with redundancy is disclosed and also a redundancy circuit using an electric fuse is described in the United States Pat. No. 4,389,715, entitled "REDUNDANCY SCHEME FOR A DYNAMIC RAM", issued on Jun. 21, 1983 to Eaton, Jr. et al.

As other prior art, a program-type circuit using an electric fuse is described in the paper, entitled "A 256K RAM Fabricated with Molybdenum-Polysilicon Technology" in a digest of technical paper of IEEE International Solid-State Circuits Conference held on Feb. 15, 1980.

As still other prior art, a program-type circuit using an electric fuse and a structure of an electric fuse are described in "Electronics" on pages 121–123 and 127–130, issued by McGraw-Hill Book Company on July 28, 1981.

SUMMARY OF THE INVENTION

Accordingly, a principal object of the present invention is to provide an electric fuse for a redundancy circuit for use in replacing defective memory cells with redundancy memory cells in a semiconductor memory, which fuse can be blown out easily and reliably at a low voltage.

Another object of the present invention is to provide an electric fuse for a redundancy circuit for use in replacing defective memory cells with redundancy memory cells in a semiconductor memory, which fuse has a blow out portion of a narrow width.

A further object of the present invention is to provide an improved method of making an electric fuse for a redundancy circuit for use in replacing defective memory cells with redundancy memory cells in a semiconductor memory, which fuse can be blown out easily and reliably at a low voltage.

Still a further object of the present invention is to provide an improved method of making an electric fuse for a redundancy circuit for use in replacing defective memory cells with redundancy memory cells in a semiconductor memory, which fuse comprises a blow out portion of a narrow width.

Briefly described, the present invention comprises an electric fuse for a redundancy circuit comprising: a semiconductor substrate, a first insulating film formed on the surface of the semiconductor substrate, an underlying film formed on the surface of the first insulating film, a second insulating film formed on the surface of the first insulating film and the surface of the underlying film, with a surface stepped portion formed with the surface of the underlying film, and a fuse material formed along an edge of the underlying film on the surface stepped portion. Since a fuse material is formed along an edge of the underlying film on the surface stepped portion, the width of the blow out portion of an electric fuse in accordance with the present invention is controlled to be narrow.

According to a method of making an electric fuse for a redundancy circuit in accordance with the present invention, a first insulating film is formed on a semiconductor substrate, an underlying film is formed on the surface of the first insulating film, a second insulating film is formed on the surface of the first insulating film and the surface of the underlying film so that a surface stepped portion may be established with the surface of the underlying film, and a fuse material is formed along an edge of the underlying film on the surface stepped portion.

In a preferred embodiment of the inventive method, a fuse material is first deposited on the surface stepped portion and then the fuse material is anisotropically etched to establish an narrow strip of the fuse material along an edge of the stepped portion. In view of the fact that the fuse material formed along an edge of the surface stepped portion has an increased thickness in terms of the vertical direction as compared with the other portion, the anisotropic etching leaves the fuse material along an edge of the surface stepped portion in the form of a narrow strip of the fuse material. Therefore, the width of the strip of the fuse material can be controlled to be narrow as a function of deposition of the fuse material. As a result, the width of the electric fuse can be easily controlled to be narrow.

In a further preferred embodiment of the inventive method, anisotropic etching is performed by RIE (Reactive Ion Etching).

These objects and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described. In describing this embodiment, portions which are to overlap with the description of the conventional technique are omitted or simplified appropriately.

Figure 5A:
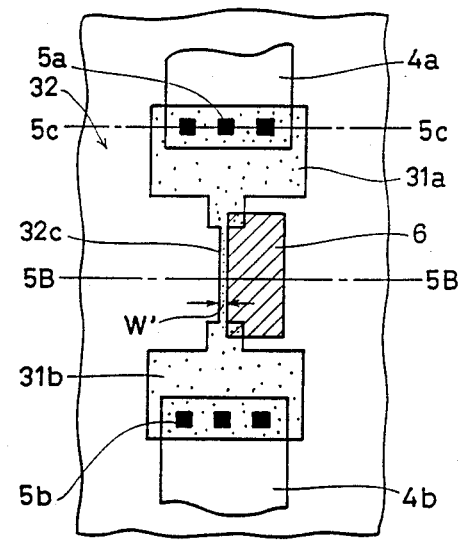
FIGS. 5A, 5B and 5C show one embodiment of the present invention and are a plan view and sectional views showing a structure of a fuse for in a redundancy circuit of a MOS dynamic RAM.
Figure 5B:
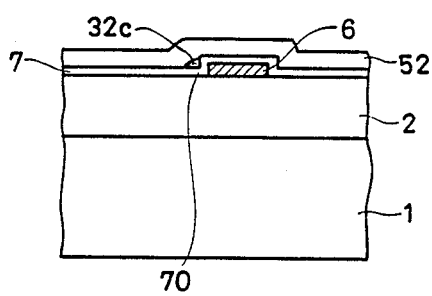
Figure 4:
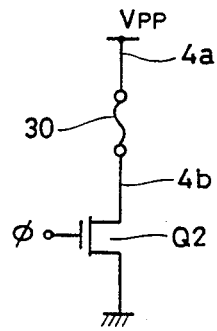
FIG. 4 is a circuit diagram for blowing out a conventional fuse for the redundancy circuit.
Figure 5C:
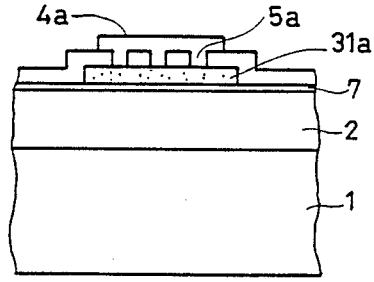

FIG. 5A is a plan view showing a structure of an electric fuse for a redundancy circuit for use in a redundancy circuit in a MOS dynamic RAM, and FIG. 5B is a sectional view taken along the line 5B—5B in FIG. 5A, FIG. 5C is a sectional view taken along the line 5C—5C in FIG. 5A.

Figure 1:
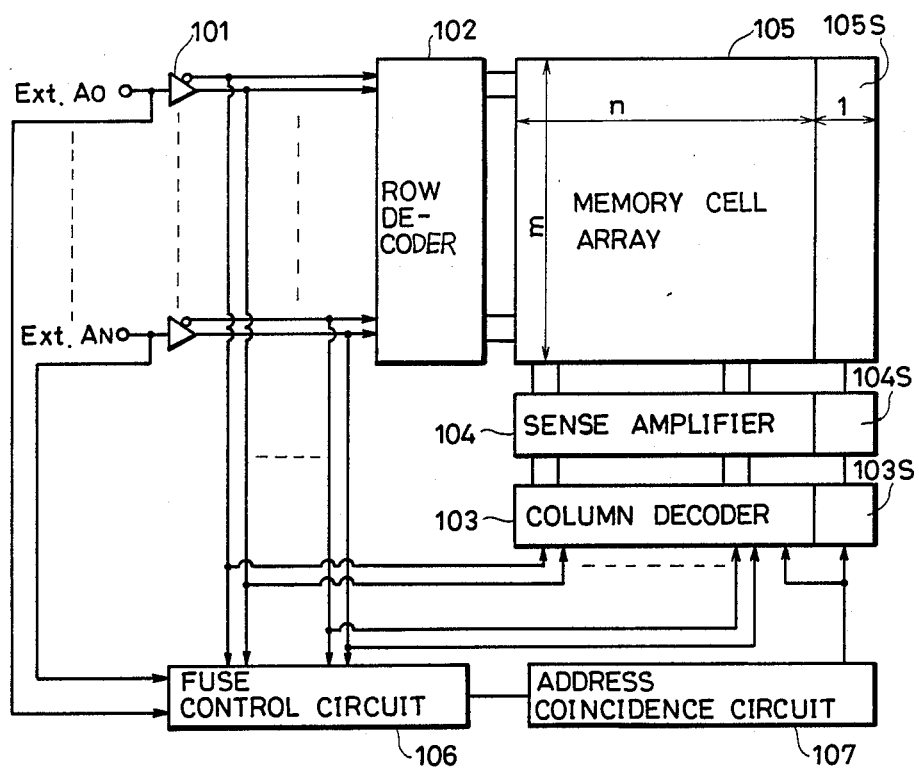
FIG. 1 is a block diagram showing a MOS dynamic RAM having the conventional redundancy circuit.
Figure 2:
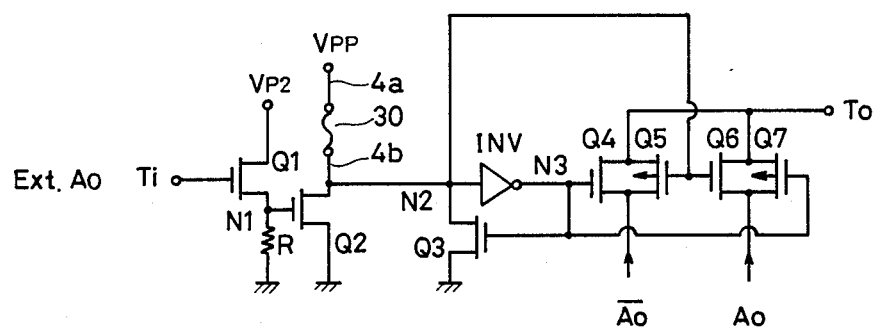
FIG. 2 is a circuit diagram showing a detailed fuse control circuit serving as the conventional redundancy circuit shown in a portion of FIG. 1.
Figure 3A:
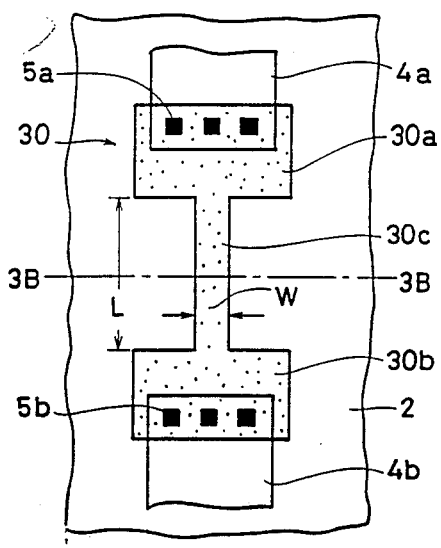
FIGS. 3A and 3B are a plan view and a sectional view showing a structure of a fuse for a redundancy circuit in a conventional MOS dynamic RAM.
Figure 3B:
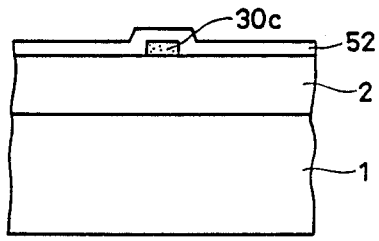

A structure of this embodiment is different from the electric fuse for a redundancy circuit in FIGS. 3A and 3B in that an underlying film 6 which is made of a polycrystal silicon film is formed on the field oxide film 2 and an insulating film 7 is formed on the field oxide film 2 and the underlying film 6. The fuse portion 32 comprising the blowout portion 32c made of a polysilicon film and terminal portions 31a and 31b connected to the opposite ends of the portion 32c is formed on the insulating film 7. The blowout portion 32c is formed along an edge of the underlying film 6 on the surface stepped portion 70 formed on the insulating film 7 corresponding to the stepped portion between the field oxide film 2 and the underlying film 6 by conventional photolithography technique of approximately 1 μm, and the width W' of the blowout portion 32c is made as narrow as 0.1–0.2 μm, as compared with the width W of the conventional blowout portion 30c.

FIGS. 6–12 are process plan views or sectional views showing a manufacturing process of an electric fuse for a redundancy circuit for use in a redundancy circuit in a MOS dynamic RAM. If A or B is allotted behind the number of the figures, that means two views represent the same process, in which a view allotted by A after the number is a plan view and a view allotted by B after the number is a sectional view. Views without A to B after the number (figures with only numeral) are sectional views.

Figure 6:
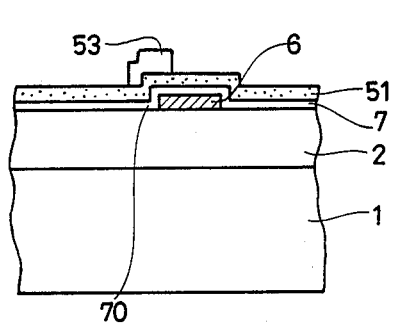
FIGS. 6–12 are plan views or sectional views showing a manufacturing process of a fuse for a redundancy circuit in a MOS dynamic RAM in accordance with the present invention.
Figure 8:
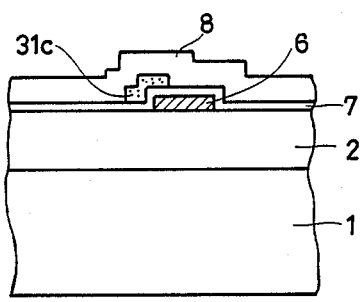
Figure 7A:
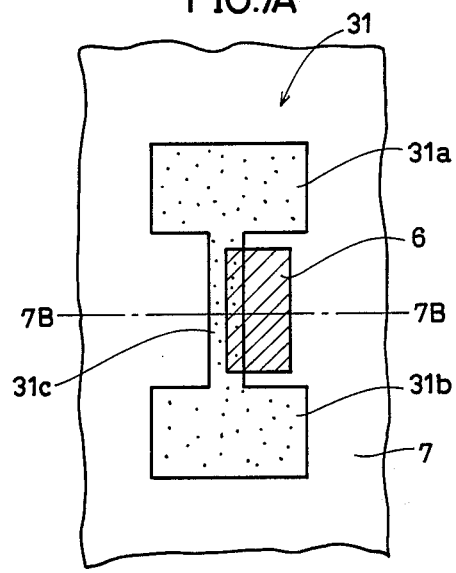
Figure 9A:
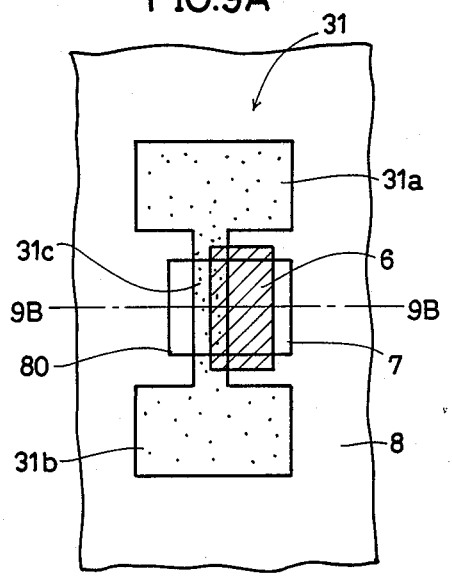
Figure 7B:
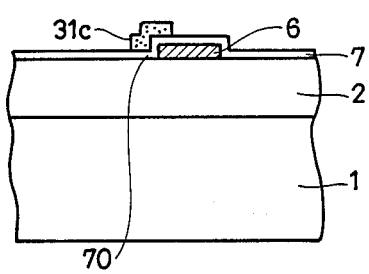
Figure 9B:
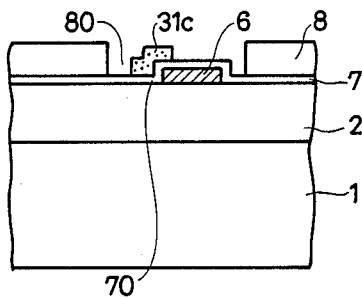
Figure 10:
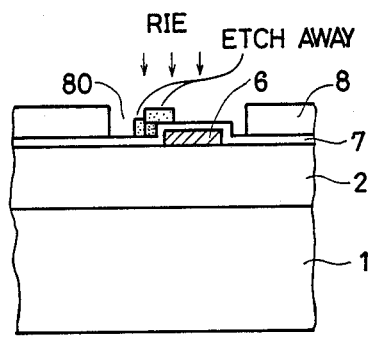
Figure 12:
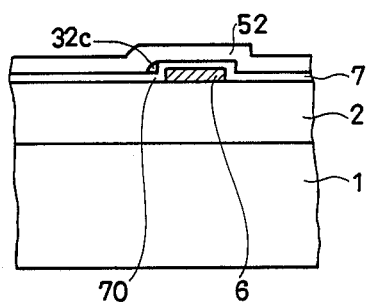
Figure 11A:
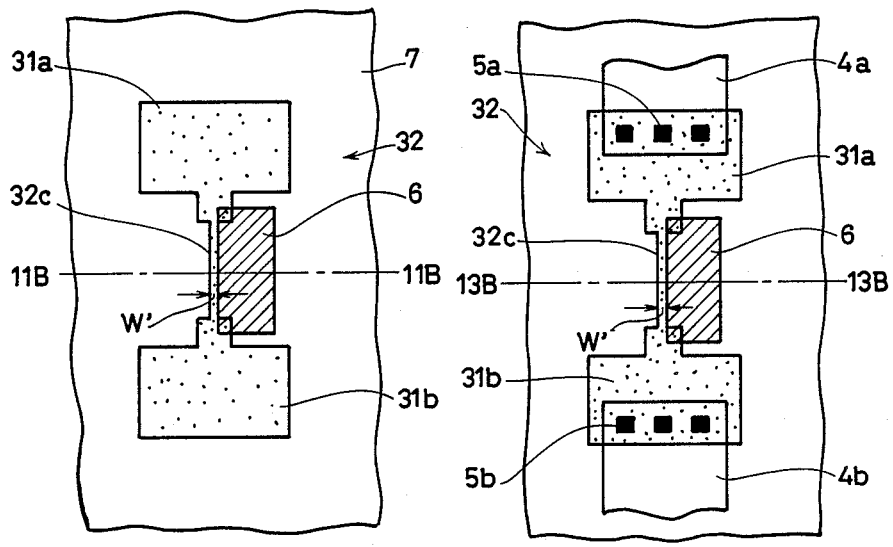
Figure 11B:
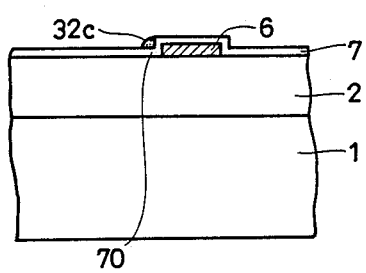

This manufacturing method is now described. First, the field oxide film 2 is formed on the silicon substrate 1. Then, a first polycrystal silicon film is formed on the field oxide film 2 and an underlying film 6 is defined by patterning this first polycrystal silicon film. Then, the insulating film 7 is formed on the field oxide film 2 and the underlying film 6. At that time, the surface stepped portion 70 is formed along an edge of the underlying film 6 corresponding to the stepped portion between the field oxide film 2 and the underlying film 6. Then, a second polycrystal silicon film 51 which is to be a fuse material is formed on the insulating film 7, and a film pattern 31 comprising the region 31c for forming a blowout portion and terminal portions 31a and 31b is formed (FIGS. 7A and 7B) by patterning that second polycrystal silicon film 51 after a resist 53 is applied (FIG. 6). At that time, the region 31c is formed so as to cover the surface stepped portion 70 and so that about a half portion of the region 31c is formed on the underlying film 6. Then, the underlying film 6 and the region 31c are insulated electrically from each other by the insulating film 7. Then, a resist 8 for photolithography is applied to all over the surface (FIG. 8). Next, an opening 80 is formed by removing the resist 8 selectively so as to expose the region 31c and the region of its side portion (FIGS. 9A and 9B). Then, when the region 31c is etched by RIE (Reactive Ion Etching) technique using the resist 8 as a mask (FIG. 10), so that a portion of the region 31c is left along an edge of the underlying film 6 on the surface stepped portion 70 as a so-called side wall, forming the blowout portion 32c. After that, when the resist 8 is removed, the blowout portion 32c comprising the side wall and the fuse portion 32 comprising the terminal portions 31a and 31b are formed on the insulating film 7 (FIGS. 11A and 11B). After that, an insulating film 52 is formed on the fuse portion 32 (FIG. 12), the terminal portion 31a and 31b of the insulating film 52 is opened and the aluminum line 4a and 4b is connected thereto, with the result that the fuse in accordance with the present invention, shown in FIGS. 5A, 5B and 5C, is completed. In addition, FIG. 5C is a sectional view taken along the line 5C—5C in FIG. 5A and showing a connection of the aluminum line 4a and a contact 5a.

Figure 13A:
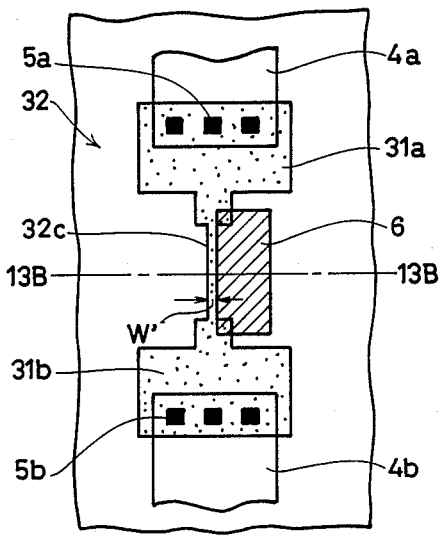
FIGS. 13A and 13B show another embodiment of the present invention and are a plan view and a sectional view showing a structure of a fuse for a redundancy circuit in a MOS dynamic RAM.
Figure 13B:
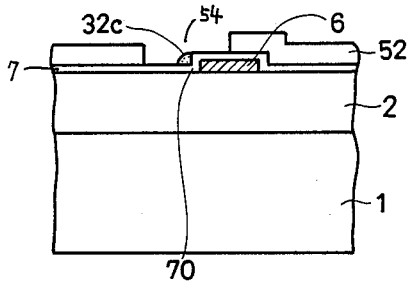

Also, as shown in FIGS. 13A and 13B, an opening 54 may be formed on the insulating film 52 around the blowout portion 32c. That step may be performed at the same time as the step for forming an opening on the insulating film 52 to connect the aluminum line 4a and 4b.

The width W' of the blowout portion 32c comprising this side wall is controlled by the film thickness of the first and second polycrystal silicon film and by the film thickness of the insulating film 7, wherein this width W' can be made 0.1–0.2 μm easily by conventional photolithographic technique of approximately 1 μm (it can be made by photolithographic technique of approximately 2 μm in some cases). Thus, the level of the power supply $V_{pp}$ applied during blowout of a fuse and the level of a control clock signal $\phi$ can be controlled to be around 5 V and as a result an electric fuse for a redundancy circuit capable of blowing out easily and reliably at a low voltage can be provided.

In view of the above mentioned description, a manufacturing process in accordance with the present invention can be characterized as described in the following. That is, referring to FIG. 7B, in the process of forming the blowout portion 32c of a fuse on the surface stepped portion 70, the region 31c formed on the surface stepped portion 70 for forming the blowout portion is formed to be uniform in thickness on the horizontal or the vertical surface of the insulating film 7 around the surface stepped portion 70. Therefore, only in the vicinity of the surface stepped portion 70, the thickness in the vertical direction is thicker than the thickness of the region 31c formed on the horizontal surface of another insulating film 7. Since the technique of RIE is anisotropic, a portion of uniform thickness in the vertical direction is removed when an etching operation in the vertical direction by RIE is performed, with the result that the portion which is thick in the vertical direction in the region 31c, that is, only portion in the vicinity of the surface stepped portion 70 is left and this portion becomes the blowout portion 32c. The present invention takes note of and employs the above-mentioned principle.

Now the RIE technique employed in a manufacturing process of the present invention is described briefly hereinafter. RIE (Reactive Ion Etching) is a technique which has been recently developed considerably as a method of etching of various kinds of thin film in a manufacturing process of LSI because a high-precision processing of fine pattern less than 3 $\mu$m is possible. A reaction seed of RIE is an active ion in plasma and has a chemical and physical (principally chemical) reaction mechanism. A characteristics of the technique is that the etching has directional property and a so-called anisotropic etching is possible.

Figure 14:
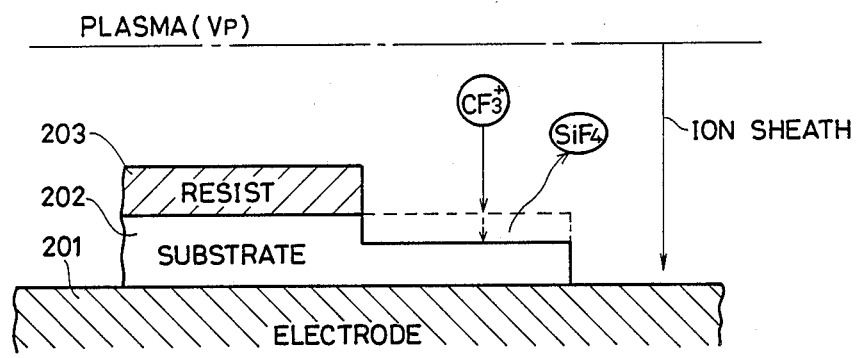
FIG. 14 is a schematic view showing a basic reaction model of RIE.

A basic reaction mechanism of RIE is described hereinafter. FIG. 14 is a view showing a basic reaction model of RIE. Referring to FIG. 14, reference numeral 201 denotes an electrode, reference numeral 202 denotes a silicon substrate placed on the electrode, reference numeral 203 is a resist formed on the silicon substrate surface 202, reference character $CF_3^+$ denotes a kind of active ion and reference character $SiF_4$ denotes a material produced after a chemical reaction. Referring to FIG. 14, an ion such as $CF_3^+$ is produced in plasma as one example. Since an ion sheath appears naturally around the electrode, an ion sheath also exists on a sample surface placed on an electrode surface and potential gradient is produced. An ion is accelerated towards an electric field by the potential for use in RIE gradient. A potential is usually in a range of approximately several tens volts through several hundreds volts under a plasma condition and this value varies depending on the circumstances in which RIE is performed, that is, a gas pressure, a high frequency power, the temperature of an electrode and the frequency of a power supply. The ion $CF_3^+$ accelerated in the ion sheath has a constant kinetic energy and collides with the substrate surface. After that, a compound of $SiF_4$ is produced and an etching is performed after reaction by principally a chemical reaction. Since the reaction proceeds in a constant direction by a directional property of an impinging active ion (such as $CF_3^+$), an anisotropic etching can be performed.

Meanwhile, RIBE (Reactive Ion Beam Etching) is performed with an active ion rendered to be like a beam, so that the development in the technique is expected in the future as it is considered that a submicron-sized pattern anisotropic etching which is more fine than RIE is possible.

In the above mentioned embodiment, although the technique of RIE is employed to form the blowout portion 32c, the blowout portion 32c also can be formed with the same or higher precision if the technique of RIBE is employed.

Meanwhile, in the above embodiment, although an underlying film was shown as being made of a polycrystal silicon film, this underlying film may be formed with an insulating film.

In the above embodiment, although a fuse material was shown as being a polycrystal silicon film, a metal film such as aluminum may be used as a fuse material.

In the above embodiment, although an electric fuse for a redundancy circuit MOS dynamic RAM was shown, the present invention can be applied to an electric fuse for a redundancy circuit of other semiconductor memories such as a MOS static RAM and ROM.

Furthermore, the present invention is applicable to PROM as another embodiment of the present invention.

A bipolar PROM is a non-volatile read-only memory to which users can write a memory content electrically, which has a small memory capacity and has a large application as compared with EPROM (Erasable Programmable ROM). Memory cells consist of two kinds, that is, one is a fuse type having a blowout portion which is blown out by applying a current, and the other is a junction type shorting a junction by applying a reverse current to the emitter-base junction. The most significant feature of the bipolar PROM is that cells which have been once written are never reprogrammable. The present invention also can be applied to the above-mentioned fuse type bipolar PROM.

As mentioned above, in accordance with the present invention, since a side wall of a fuse material is formed by RIE technique so that this may be a blowout portion of a fuse portion, it is possible to make narrow the width of the blowout portion to approximately 0.1–0.2 $\mu$m, with the result that an electric fuse for a redundancy circuit can be obtained, which is capable of being blown out easily and reliably at a low voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrically blowable fuse for a redundancy circuit for use in replacing defective memory cells with redundancy memory in a semiconductor memory, comprising:
    a semiconductor substrate;
    a first insulating film formed on a surface of said semiconductor substrate;
    an underlying film formed on a surface of said first insulating film;
    said underlying film formed between terminal portions of the electrically blowable fuse and defining a longitudinal direction;
    a second insulating film formed on the surface of said first insulating film and a surface of said underlying film and forming a surface stepped portion along an edge of the underlying film; and
    a sidewall of the surface stepped portion comprising an electrically blowable fuse material disposed in said longitudinal direction defined by said underlying film between said terminal portions of the fuse, said sidewall disposed along an edge of the surface stepped portion.

2. An electrically blowable fuse for a redundancy circuit in accordance with claim, wherein said semiconductor substrate comprises silicon.

3. An electrically blowable fuse for a redundancy circuit in accordance with claim 2, wherein said underlying film comprises polycrystal silicon.

4. An electrically blowable fuse for a redundancy circuit in accordance with claim 2, wherein said underlying film comprises an insulating film.

5. An electrically blowable fuse for a redundancy circuit in accordance with claim 2, wherein said fuse material comprises polycrystal silicon.

6. An electrically blowable fuse for a redundancy circuit in accordance with claim 2, wherein said fuse material comprises a metal.

7. An electrically blowable fuse for a redundancy circuit in accordance with claim 2, which further comprises an overlying insulating film formed overlying said fuse material and said second insulating film.

8. An electrically blowable fuse for a redundancy circuit in accordance with claim 7, wherein said overlying insulating film has an opening formed therein at a region of said fuse material to be blown.

9. An electrically blowable fuse for a redundancy circuit in accordance with claim 7, wherein said overlying insulating layer has openings formed therein at opposite ends of said fuse material and further comprising metal leads contacting said fuse material through said openings.

10. An electrically blowable fuse as recited in claim 1, wherein said fuse material comprises a strip formed on said stepped portion of said second insulating film, said strip including a first portion longitudinally overlying a portion of said underlying film and a second portion along the edge of said underlying film, thereby providing a longitudinal sidewall by anisotropic etching.

11. An electrically blowable fuse as recited in claim 1, wherein said stepped portion of said second insulating film includes two longitudinally oriented edges, and wherein said fuse material sidewall is disposed along only a single one of said edges.

12. An electrically blowable fuse as recited in claim 1, wherein said sidewall and said edge of the surface stepped portion have substantially identical lengths and are substantially coextensive in said longitudinal direction.

13. An electrically blowable fuse for a redundancy circuit for use in replacing defective memory cells with redundancy memory, provided by the steps of:
forming a first insulating film on a semiconductor substrate;
forming an underlying film on a surface of said first insulating film, said underlying film formed between terminal portions of the electrically blowable fuse and defining a longitudinal direction between the terminal portions;
forming a second insulating film on a surface of said first insulating film and a surface of said underlying film to establish a surface stepped portion along an edge of said underlying film; and
forming, for the surface stepped portion, a sidewall of electrically blowable fuse material along an edge of said surface stepped portion in said longitudinal direction defined by said underlying film.

14. An electrically blowable fuse for a redundancy circuit in accordance with claim 13, wherein
said step of forming said sidewall of electrically blowable fuse material comprises the steps of
depositing a fuse material on said surface stepped portion, and
anisotropically etching said fuse material to establish a narrow strip of said fuse material along said edge of said surface stepped portion.

15. An electrically blowable fuse for a redundancy circuit in accordance with claim 13, wherein
said fuse material is formed into said sidewall by anisotropically etching said fuse material along said edge of said surface stepped portion by a step of RIE.

16. An electrically blowable fuse for a redundancy circuit in accordance with claim 15; wherein said semiconductor substrate comprises silicon.

17. An electrically blowable fuse for a redundancy circuit in accordance with claim 16, wherein said underlying film comprises polycrystal silicon.

18. An electrically blowable fuse for a redundancy circuit in accordance with claim 16, wherein said underlying film comprises an insulating film.

19. An electrically blowable fuse for a redundancy circuit in accordance with claim 16, wherein said fuse material comprises polycrystal silicon.

20. An electrically blowable fuse for a redundancy circuit in accordance with claim 16, wherein said fuse material comprises a metal.

21. An electrically blowable fuse for a redundancy circuit in accordance with claim 13, which further comprises an overlying insulating film formed overlying said fuse material and said second insulating film.

22. An electrically blowable fuse for a redundancy circuit in accordance with claim 21, wherein said overlying insulating film has an opening formed therein at a region of said fuse material to be blown.

23. An electrically blowable fuse for a redundancy circuit in accordance with claim 21, wherein said overlying insulating film has openings formed therein at opposite ends of said fuse material and metal leads contacting said fuse material through said openings.

24. An electrically blowable fuse for a redundancy circuit for use in replacing defective memory cells with redundancy memory in a semiconductor memory, comprising:
a semiconductor substrate;
an insulating layer formed on a surface of said semiconductor substrate and having a major surface;
said insulating layer including a stepped portion along an edge of said major surface;
said edge oriented substantially in a longitudinal direction defined between terminal portions of the fuse, and
a fuse material on the major surface and having an electrically blowable fuse region disposed along an edge of said stepped portion of said insulating layer as a sidewall thereof,
wherein said edge of said stepped portion of said insulating layer and said fuse material sidewall of said insulating layer are oriented substantially in said longitudinal direction defined between said terminal portions of the fuse.

25. An electrically blowable fuse as recited in claim 24 wherein said fuse region has a width in the range of 0.1 micron to 0.2 micron thereby reducing voltage and current requirements for blowing said fuse region.

26. An electrically blowable fuse for a redundancy circuit for use in replacing defective memory cells with redundancy memory in a semiconductor memory, comprising:
a semiconductor substrate;
an insulating layer formed on a surface of said semiconductor substrate and having a major surface;
said insulating layer including a stepped portion along an edge of said major surface;
said edge oriented substantially in a longitudinal direction defined between terminal portions of the fuse, and
a fuse material formed on the major surface and having an electrically blowable fuse region along an edge of said stepped portion of said insulating layer as a sidewall thereof, wherein said edge of said stepped portion of said insulating layer and said fuse material sidewall of said insulating layer are oriented substantially in said longitudinal direction defined between said terminal portions of the fuse, the fuse region having a width commensurate with a thickness of the fuse material.

27. An electrically blowable fuse for a redundancy circuit for use in replacing defective memory cells with redundancy memory in a semiconductor memory, comprising:

a semiconductor substrate;

an insulating layer formed on a surface of said semiconductor substrate and having a major surface;

said insulating layer including a stepped portion along an edge of said major surface;

said edge oriented substantially in a longitudinal direction defined between terminal portions of the fuse, and an electrically blowable fuse strip formed to have a width commensurate with a thickness of a fuse material by depositing the fuse material on said major surface and on said stepped portion of said insulating layer and by anisotropically etching said fuse material to establish along said stepped portion a sidewall of said fuse material, wherein said stepped portion of said insulating layer and said fuse strip sidewall of said insulating layer are disposed to have longitudinal directions oriented substantially in said longitudinal direction defined between said terminal portions of the fuse.

28. An electrically blowable fuse for a redundancy circuit for use in replacing defective memory cells with redundancy memory in a semiconductor memory, comprising:

a semiconductor substrate;

an insulating layer formed on a surface of said semiconductor substrate and having a major surface including a stepped portion;

a strip of an electrically blowable fuse material formed on an edge of the stepped portion of the major surface of said insulating layer;

said edge of said stepped portion oriented substantially in a longitudinal direction defined between terminal portions of the fuse, and a sidewall of said insulating layer including said strip of fuse material, said sidewall oriented substantially in said longitudinal direction defined between terminal portions of the fuse.

29. An electrically blowable fuse as recited in claim 28, wherein said stepped portion of said insulating layer includes two longitudinally oriented edges, and wherein said fuse material sidewall is disposed along only a single one of said edges.

30. An electrically blowable fuse as recited in claim 29, wherein said strip of fuse material and said longitudinal edge of said stepped portion are substantially coextensive and have substantially identical lengths.

31. An electrically blowable fuse as recited in claim 28, wherein said strip of fuse material and said longitudinal edge of said stepped portion are substantially coextensive and have substantially identical lengths.

32. An electrically blowable fuse for a redundancy circuit for use in replacing defective memory cells with redundancy memory in a semiconductor memory comprising:

a semiconductor substrate;

an insulating layer formed on a surface of said semiconductor substrate and having a major surface;

said insulating layer including a stepped portion along an edge of said major surface; wherein an electrically blowable fuse region is formed along an edge of said stepped portion to provide a sidewall of said stepped portion, said electrically blowable fuse region having a width substantially equal to a thickness of a strip of a fuse material including said fuse region and formed on said insulating layer, wherein said sidewall is oriented to have a longitudinal direction thereof arranged substantially in a direction defined between terminal portions of the electrically blowable fuse.

* * * * *